(12) United States Patent
Tozer et al.

(10) Patent No.: US 7,903,404 B2
(45) Date of Patent: Mar. 8, 2011

(54) DATA CENTERS

(75) Inventors: Robert Tozer, Kingston upon Thames (GB); Cullen Bash, Los Gatos, CA (US); Chandrakant Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 12/432,170

(22) Filed: Apr. 29, 2009

(65) Prior Publication Data

US 2010/0277863 A1 Nov. 4, 2010

(51) Int. Cl.
*H05K 7/20* (2006.01)
*H01L 23/40* (2006.01)

(52) U.S. Cl. ......... 361/690; 361/679.47; 361/679.53; 361/696; 361/699; 361/700; 165/80.5; 165/104.21; 165/104.34; 165/185; 62/259.2; 62/118; 62/119; 62/185; 454/184

(58) Field of Classification Search ......... 361/679.46, 361/679.47, 679.48, 679.5, 679.53, 688, 361/689, 690–702, 724–728, 730, 752; 454/184, 454/233, 236, 253, 345, 347, 359, 245; 62/118, 62/119, 132, 171, 259.1, 259.2, 440, 441, 62/267, 89, 178, 180; 165/80.2, 80.3, 80.4, 165/80.5, 121–126, 104.21, 104.33, 104.34
See application file for complete search history.

(56) References Cited

U.S. PATENT DOCUMENTS

| | | | | |
|---|---|---|---|---|
| 5,440,894 A * | 8/1995 | Schaeffer et al. | | 62/203 |
| 5,718,628 A * | 2/1998 | Nakazato et al. | | 454/184 |
| 5,743,102 A * | 4/1998 | Thomas et al. | | 62/185 |
| 6,973,801 B1 * | 12/2005 | Campbell et al. | | 62/259.2 |
| 7,012,807 B2 * | 3/2006 | Chu et al. | | 361/699 |
| 7,233,491 B2 * | 6/2007 | Faneuf et al. | | 361/689 |
| 7,511,959 B2 * | 3/2009 | Belady et al. | | 361/701 |
| 2004/0050231 A1 * | 3/2004 | Chu et al. | | 83/574 |
| 2007/0209782 A1 * | 9/2007 | Wyatt et al. | | 165/76 |
| 2007/0213881 A1 * | 9/2007 | Belady et al. | | 700/300 |
| 2007/0297136 A1 * | 12/2007 | Konshak | | 361/699 |
| 2008/0223074 A1 * | 9/2008 | Pachai et al. | | 62/513 |
| 2008/0266726 A1 * | 10/2008 | Murakami et al. | | 361/1 |
| 2009/0188264 A1 * | 7/2009 | Fair et al. | | 62/113 |
| 2009/0201645 A1 * | 8/2009 | Kashirajima et al. | | 361/700 |
| 2009/0244829 A1 * | 10/2009 | Weber et al. | | 361/679.47 |
| 2009/0244830 A1 * | 10/2009 | Wyatt et al. | | 361/679.47 |
| 2010/0146996 A1 * | 6/2010 | Campbell et al. | | 62/119 |
| 2010/0149754 A1 * | 6/2010 | Chapel et al. | | 361/696 |

FOREIGN PATENT DOCUMENTS

WO    WO8902569 A1 *   3/1989

* cited by examiner

Primary Examiner — Michael V Datskovskiy

(57) ABSTRACT

According to one embodiment, a data center comprises a first data center section comprising one or more equipment element elements. Each computer element has one or more heat generating sources. A second data center section comprises a heat exchanger, the second data center section being substantially segregated from the first section. A heat transfer element is thermally coupled to at least some of the heat generating sources and is further thermally coupled to the heat exchanger.

18 Claims, 5 Drawing Sheets

DATA CENTERS

BACKGROUND

For various economic and business reasons enterprises are increasingly centralizing their backend computer systems in purpose built data centers. Data centers typically house high concentrations and densities of such computer systems and additionally provide facilities such as uninterruptible power supplies and cooling systems necessary for the operation of the computer systems in the data center.

Computer systems inherently generate heat during operation. Typical heat generating sources in a computer system include central processing units (CPUs), graphics cards, mechanical storage drives, power supplies, and the like. This heat needs to be managed such that the maximum operating temperature of the various components of each computer system is not exceeded.

Individual computer systems, such as servers, typically use heat sinks to remove heat from heat generating sources. The heat is then evacuated outside the computer system housing by one or more internal mechanical fans which draw in cooler air from outside the computer system housing and exhaust warmed air through an exhaust vent. Typically computer systems are designed to draw air in through a vent on the front of the system and to exhaust warmed air through a vent in the rear of the system.

When arranged in data centers, computer equipment is generally arranged in racks, with each rack containing multiple items of computer equipment. Data centers also generally use computer room air conditioning units that supply cooled air to the front of the racks and evacuate heated air from the back of the racks.

Accordingly, a significant proportion of the operating cost of a data center can arise from the operation of cooling systems, both within individual computer equipment and at the data center infrastructure level.

BRIEF DESCRIPTION OF DRAWINGS

Embodiments of various systems and methods will now be described, by way of non-limiting example only, with reference to the accompanying drawings, in which.

DETAILED DESCRIPTION

Figure 1A:
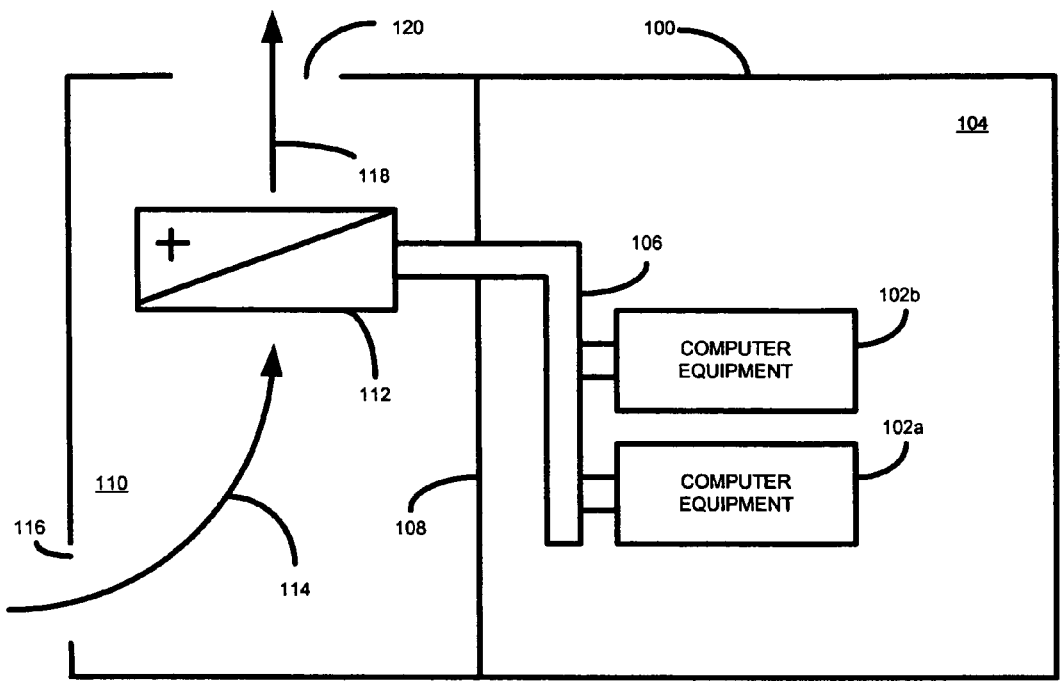
FIGS. 1a and 1b are block diagrams showing simplified section views of data centers according to one embodiment.

Referring now to FIG. 1, there is shown a simplified section view of a data center 100 according to an embodiment of the present invention.

The data center is arranged into a first section, 104, housing computer equipment 102a and 102b, and a second section, 110, housing a heat exchanger 112. The computer equipment 102a and 102b may be arranged in a standard rack or cabinet type arrangement, although for clarity no rack structure is shown. For simplicity only two pieces of computer equipment 102a and 102b are shown in the rack arrangement, however those skilled in the art will appreciate that racks may also containing many more pieces of computer equipment. The computer equipment 102a and 102b may be, for example, computer servers, with each piece of computer equipment comprising one or more heat generating sources, such as central processing units, graphics cards, DVD drives, power supplies, and the like.

The data center sections 104 and 110 are substantially segregated by a barrier 108, such that air within each of the sections 104 and 110 is substantially thermally insulated from each other. The barrier 108 may be a physical barrier, such as wall or partition.

Figure 1B:
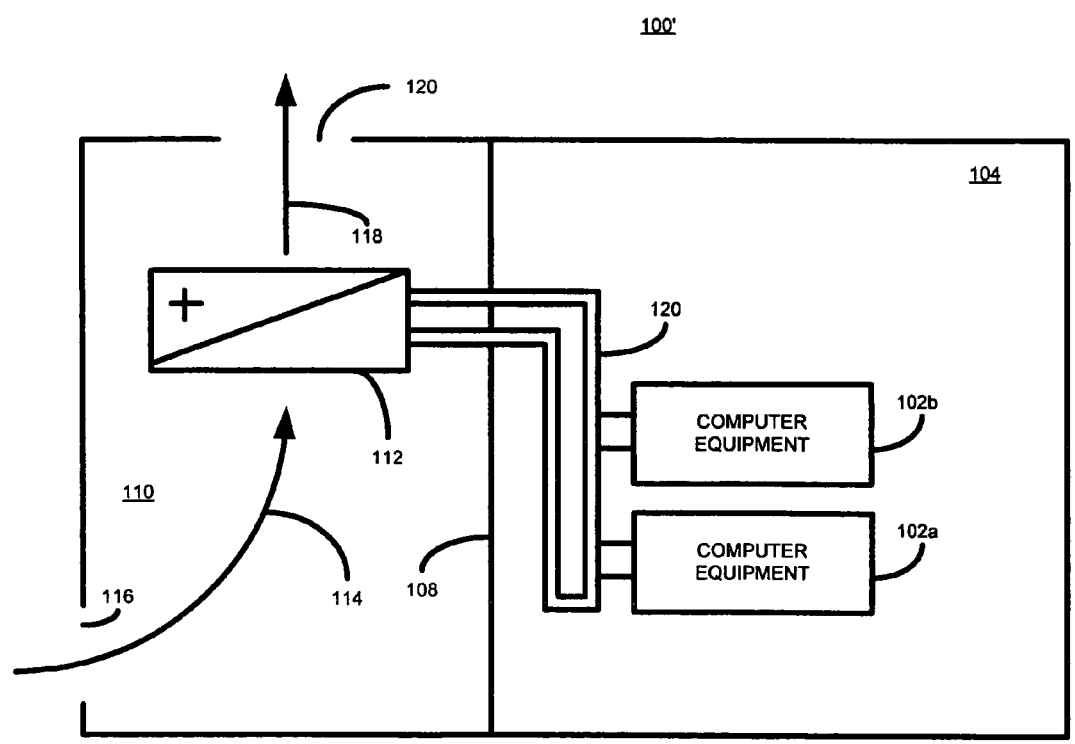

At least some of the heat generating sources of the computer equipment 102a and 102b are thermally coupled to a heat pipe 106. FIG. 1b shows a further embodiment in which a thermosiphon 120 is used in place of a heat pipe.

For example, each heat generating source may be thermally coupled directly to the heat pipe, or indirectly through separate heat pipes, thermosiphons, or in any other appropriate manner.

The heat pipe 106 removes heat from the heat generating sources to which it is thermally coupled and transports the heat from data center section 104 to the heat exchanger 112 in data center section 110. This prevents a build up of excess heat in the computer equipment 102a and 102b enabling the computer equipment to operate within its predetermined temperature operation range. The section of the heat pipe within data center section 104 may be thermally insulated from the air within the data center section 104.

In the present embodiment the heat exchanger 112 is suitable for being cooled by air, such as a tubed and finned heat exchanger, or the like. The precise type and technical characteristics of the heat exchanger may be determined by taking into account various parameters including, for example, the maximum outside air temperature, maximum operating temperature of the computer equipment, working fluid of the heat pipe or thermosyphon, density of computer equipment, and the altitude of the data center.

When the computer equipment 102a and 102b is in operation, heat generated by the heat generating sources to which the heat pipe 106 is thermally coupled is transferred to the heat pipe, and is in turn transferred to the heat exchanger 112. As the heat exchanger 112 heats up air 118 in contact with the heat exchanger 112 rises and is exhausted through an outlet vent 120. This action draws in cooler outside air 114, through an inlet vent 116, which is in turn heated up by the heat exchanger. In this way, the heat exchanger is cooled by natural stack effect ventilation.

Figure 2:
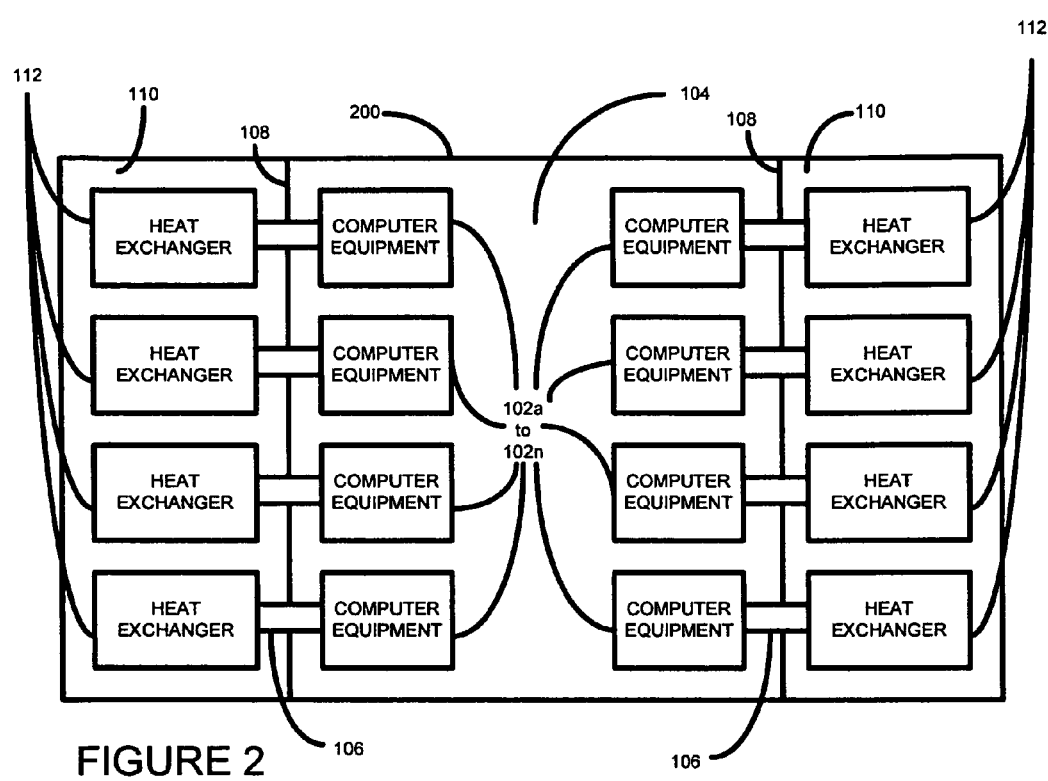
FIG. 2 is a simplified plan view of a data center according to one embodiment.

Referring now to FIG. 2, there is shown a simplified plan view of a data center 200, according to an embodiment of the present invention. Like references shared with FIG. 1 indicate like elements.

The data center 200 is arranged in a transportable container, such as an Intermodal Transport Unit (ITU), a shipping container, a POD (performance optimized data center) or the like. The data center has a first data center section 104 housing computer equipment 102a to 102n arranged in racks (not shown). The first data center section 104 is arranged to have an access aisle, to provide human access to the computer equipment 102a to 102n. The computer equipment in the racks is arranged such that the front access to the computer equipment is easily accessible from the access aisle.

Two second data center sections 110, on either side of the data center, house a plurality of heat exchangers 112. The first 104 and second 110 data center sections are segregated by barriers 108 such that air in the two sections is thermally insulated from one another.

In the embodiment shown there is one heat exchanger 112 per rack of computer equipment, although further embodiments may provide for other configurations. For example, multiple racks may be thermally coupled to a single heat exchanger, or individual computer equipment may be thermally coupled to individual or multiple heat exchangers. The computer equipment 102a to 102n is thermally coupled, via a heat pipe, thermosiphon, or the like, to a corresponding one of the heat exchangers 112.

The arrangement of the data center 200 concentrates the heat removed from multiple elements of the computer equipment 102a to 102n into a segregated section of the data center. For example, in the data center 200 it can be seen that the heat is concentrated in the two data center sections 110 on either side of the data center.

This in turn facilitates the cooling of the heat exchangers 112 (and ultimately the cooling of the computer equipment 102a to 102n). For example, the concentration of heat in section 110 improves stack effect ventilation and allows for the heat exchangers to be cooled using only free air cooling, in one embodiment.

By providing the data center 200 in a container, the data center may be deployed rapidly without requiring extensive infrastructure and facilities, such as a physical building in which to house the data center 200, chilled or cooled water supplies or air conditioning systems for cooling the computer equipment 102a to 102n. At a minimum only a suitable power source and a network connection is required.

Figure 3:
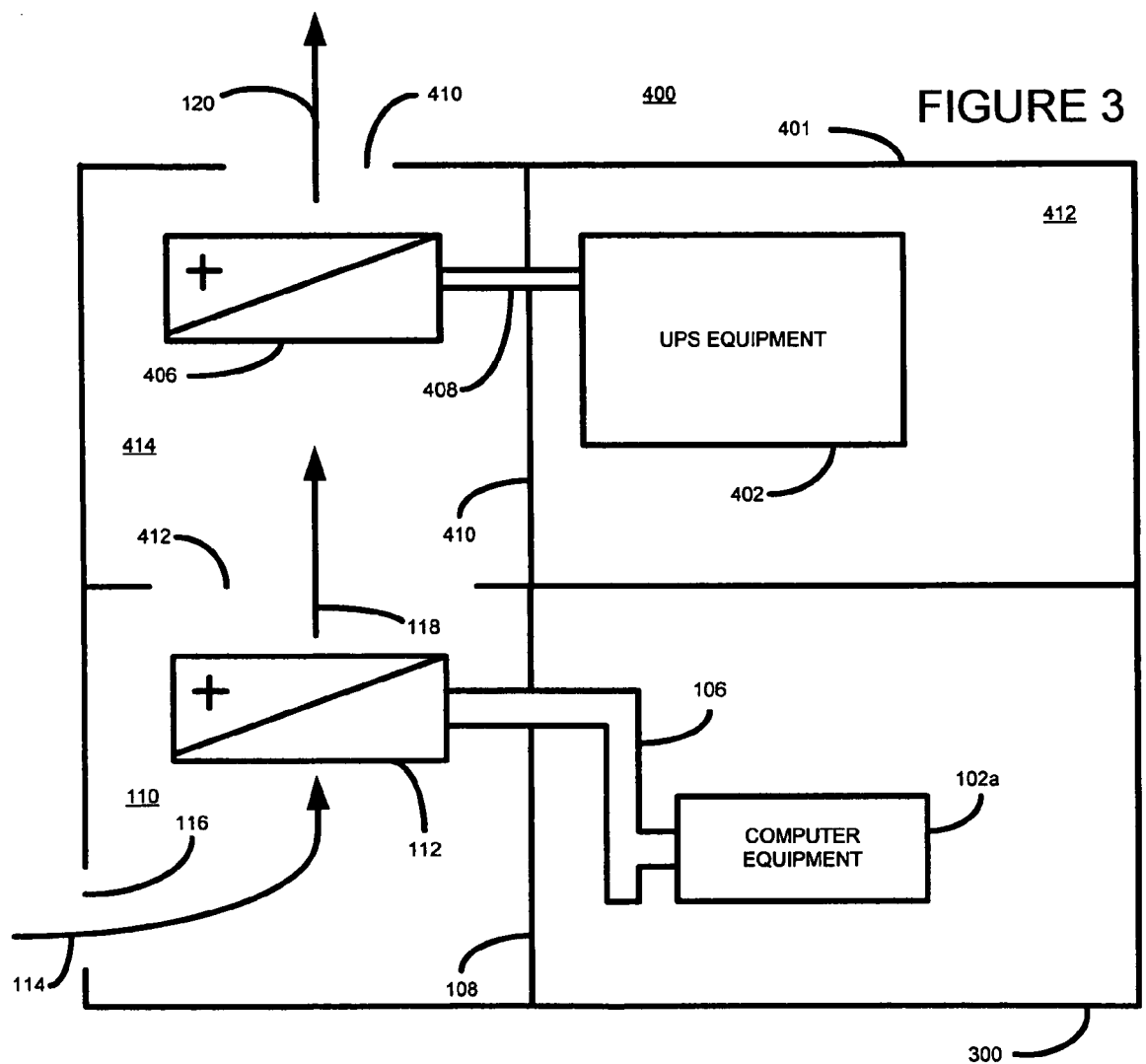
FIG. 3 is a simplified section view of a containerized data center according to an embodiment.

FIG. 3 shows a containerized data center 400 according to an embodiment of the present invention. The data center 400 comprises a containerized data center 100 on top of which is placed a containerized uninterruptible power supply (UPS) module 401. The UPS module 401 has a first section 412 housing UPS equipment 402 for supplying uninterruptible power to the computer equipment 102a to 102n in the data center 300. The UPS module 401 also has a second section 414 housing a heat exchanger 406. The first 412 and second 414 sections are substantially physically segregated from a second section 414 by a barrier 410, such that air within the two sections is substantially thermally insulated.

The UPS equipment 402 comprises a number of heat generating sources (not shown), such as AC and DC transformers. The heat sources are thermally coupled to the heat exchanger 406 using, for example, a thermosiphon or heat pipe 408.

The UPS module 401 has a base air inlet vent 412 in the second section 414 that is arranged to substantially communicate with the air exhaust vent 120 of the data center 100. In this way, heated air 118 from the heat exchanger 112 of data center 100 may freely circulate into the section 414. The heated air 118 passes through the heat exchanger 406 and is further heated, removing heat from the heat exchanger 406. The heated air 120 rises and is exhausted through an exhaust air vent 410 in the roof of the UPS module 401.

By mounting the UPS module 401 vertically above the data center 300, the data center section 110 and UPS module section 414 are in fluid communication to effectively form a single section housing heat exchangers 112 and 406. The additional heat given off by the heat exchanger 406 increases stack effect ventilation and increases the amount of outside air 114 drawn in and in turn increases the free air cooling of the heat exchangers 112 and 406.

In a yet further embodiment, one or more containerized data centers 300, may be stacked on top of one another in a similar manner to that shown in FIG. 3. Those skilled in the art will appreciate that the top data center can include a floor-based inlet vent that substantially corresponds with the roof-based exhaust vent of the lower data center such that the second sections of the stack data centers are in fluid communication.

According to further embodiments of the present invention, additional cooling elements may be used to supplement the free air cooling of the heat exchangers 112 for situations where free air cooling alone is insufficient. This may be useful, for example, when the outside air temperature or other ambient conditions exceed a predetermined threshold. Supplementary cooling elements may include, for example, devices for increasing air throughput, such as mechanical fans, or devices to cool outside air used to cool the heat exchangers, such as cooling cools, adiabatic coolers, computer room air conditioning units, and so on.

Figure 4:
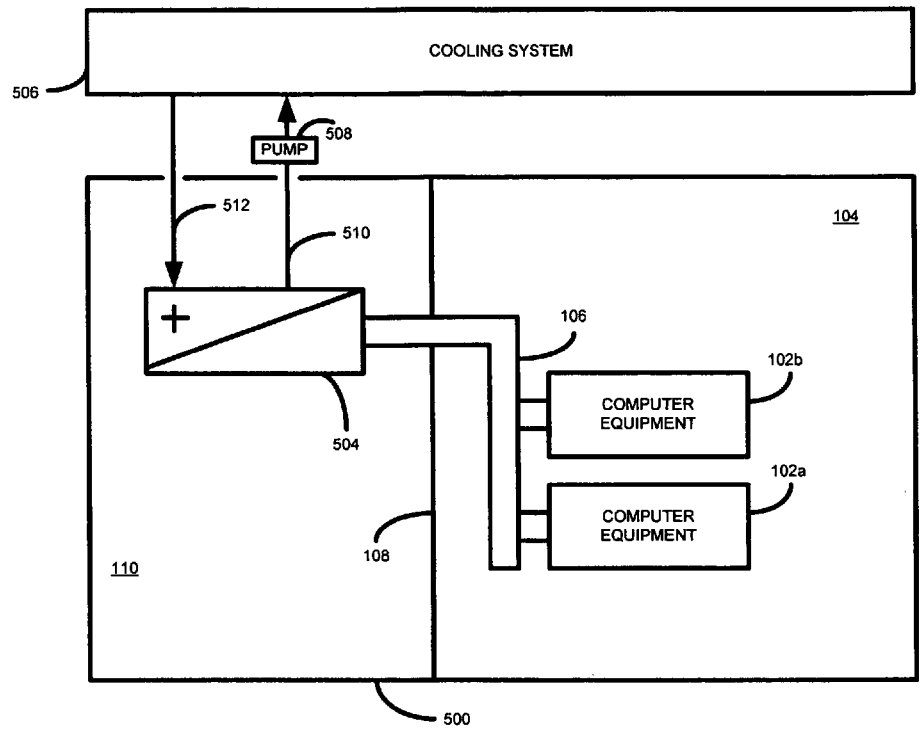
FIG. 4 is a simplified section view of a further containerized data center according to another embodiment.

FIG. 4 shows a data center 500 according to a yet further embodiment. Like references shared with FIG. 1 indicate like elements. The data center 500 has a heat exchanger 504. The heat exchanger 504 may be any type of heat exchanger suitable for being liquid cooled, such as a plate, shell and tube, and pipe in pipe heat exchanger.

The heat exchanger 504 is thermally coupled to a cooling system 506 by a liquid cooling circuit comprising an out pipe 510 and a return pipe 512. The cooling system 506 is external to the data center 500 and may be suitably located atop the data center 500. The liquid coolant in the out pipe 510 is pumped, by pump 508, to force the coolant in the cooling circuit to remove heat from the heat exchanger 504 and to transport the heat to the cooling system 506.

Figure 5A:
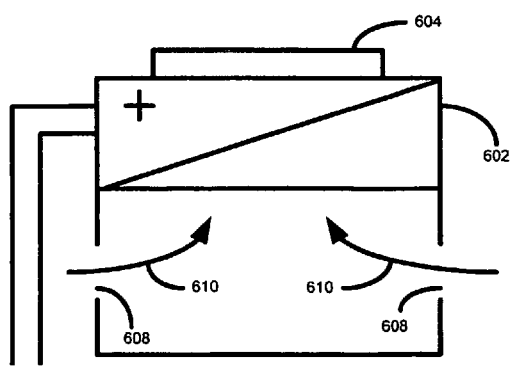
FIGS. 5a and 5b are a simplified section view of a cooling system according to one embodiment.

In a yet further embodiment, shown in FIG. 5a, the cooling system 506 comprises a heat exchanger 602 which is thermally coupled to the cooling circuit supply and return pipes 510 and 512. In proximity to the heat exchanger 602 is a mechanical fan 604 for drawing outside air 610 through inlet vents 608 and through the heat exchanger 602, providing dry air cooling to the heat exchanger 602 and ultimately the computer equipment 102.

Figure 5B:
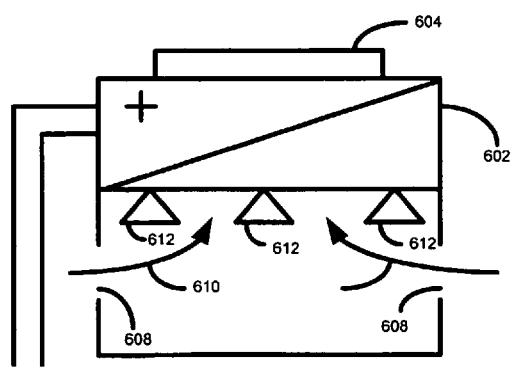

In a still further embodiment, shown in FIG. 5b, the cooling system 506 additionally includes one or more water sprays 612 to provide adiabatic cooling of the outside air prior to it being used to cool the heat exchanger 602.

Figure 6:
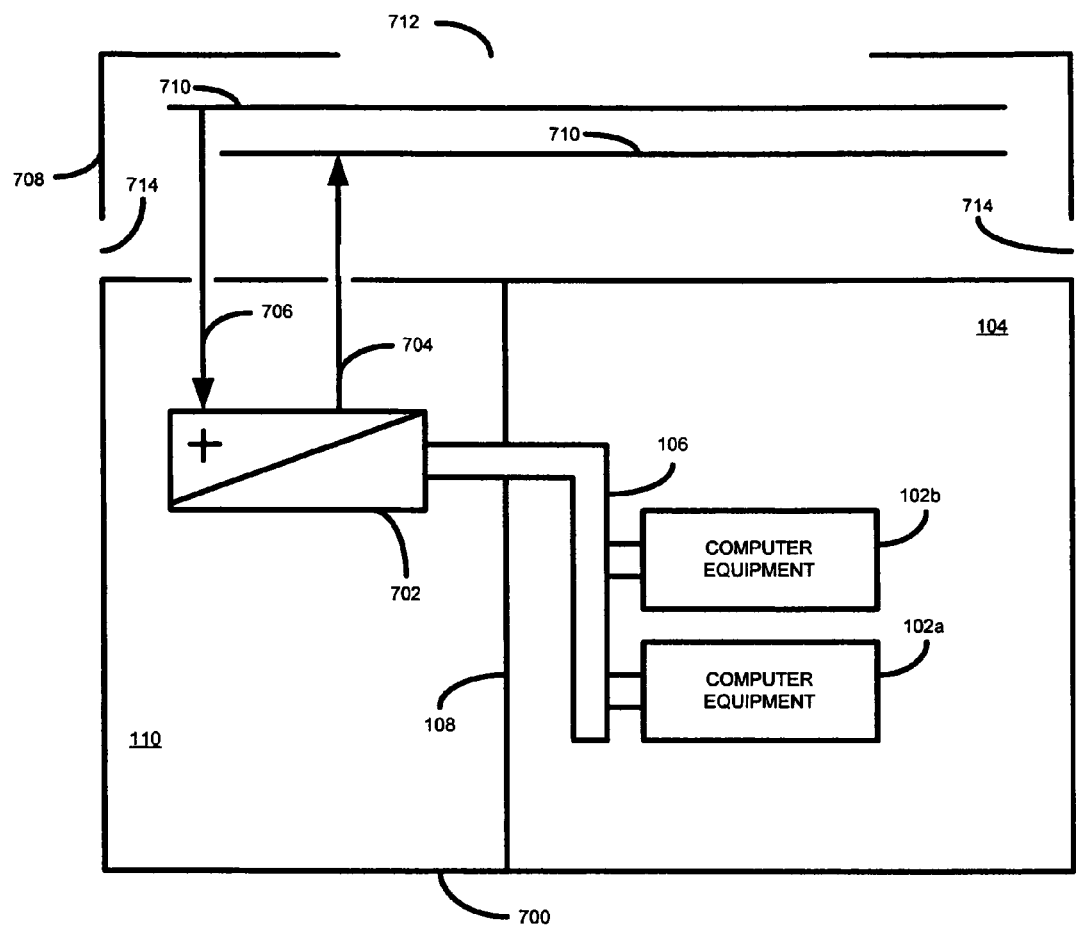
FIG. 6 is a simplified section of a further containerized data center according to another embodiment.

FIG. 6 shows a data center 700 according to a further embodiment. Like references shared with FIG. 1 indicate like elements. The computer equipment 102 is thermally coupled to a heat exchanger 702 by a heat pipe 106. In an alternative embodiment a thermosiphon could be used. The heat exchanger 702 is additionally thermally coupled to a pair of thermosiphons 710 in a thermosiphon cooling system 708. The thermosiphons 710 are cooled by free air cooling, by exhausting heated air through an exhaust vent 712 and by drawing in outside air through inlet vents 714.

In one or more embodiments, the data centers do not require an external supply of cooled air, liquid or water. In this way, the data centers according to the present embodiments are substantially self-contained, requiring only external power and computer network connections.

Due to the efficiency of heat pipes and thermosiphons at removing heat directly from the heat sources within the computer equipment 102, the computer equipment 102 can eliminate the use of internal mechanical fans to cool the heat sources. Furthermore, due to the efficiency with which the heat pipes or thermosiphons remove heat to the data center section 110, the air in data center section 104 may not require cooling, such as through use of mechanical air conditioning units. Additionally, many of the present embodiments require no mechanical cooling elements, such as fans and pumps, leading to even greater reduction in energy consumed.

Although the embodiments described herein refer primarily to computer equipment having one or more heat generating sources, those skilled in the art will appreciate that the present invention is in no way limited thereto. For example, the computer equipment described herein may be substituted by any suitable equipment element having one or more heat generating sources. Such equipment elements may include, for example, other electronic or mechanical equipment, such as power supplies, transformers, pumps, lighting equipment and the like. Furthermore, those skilled in the art will further appreciate that reference made herein to data centers is not limited thereto, and could encompass other facilities housing one or more equipment elements.

Although the embodiments described herein use thermosiphons or heat pipes, those skilled in the art will appreciate that other suitable heat transfer elements or conductors may be used. Such as, for example, a pumped liquid loop or mechanical refrigeration loop.

The invention claimed is:

1. A facility comprising:
    a first facility section comprising one or more equipment elements, each equipment element having one or more heat generating sources;
    a second facility section comprising a heat exchanger, the second facility section being substantially segregated from the first facility section; and
    a heat transfer element thermally coupled to at least some of the heat generating sources and further thermally coupled to the heat exchanger; and
    an exhaust vent for exhausting air heated by the heat exchanger to the outside of the facility, and an inlet vent through which outside air may be drawn to cool the heat exchanger, arranged such that, during operation of the equipment element, the heat exchanger is cooled using stack effect ventilation in which heated air is naturally evacuated through the exhaust vent causing outside air to be drawn in through the inlet vent.

2. The facility of claim 1, wherein the heat transfer element is a heat pipe, and wherein the heat pipe is thermally coupled to at least some of the heat generating sources by one of a heat pipe or a thermosiphon.

3. The facility of claim 1, wherein the heat transfer element is a thermosiphon, and wherein the thermosiphon is thermally coupled to at least some of the heat generating sources by one of a heat pipe or a thermosiphon.

4. The facility of claim 1, wherein the equipment element is not mechanical ventilated or cooled.

5. The facility of claim 1, wherein the air in the first facility section is not mechanically ventilated or cooled.

6. The facility of claim 1, wherein the facility is arranged in a transportable container, the facility further comprising a second transportable facility located on top of the facility such that the exhaust vent of the first facility corresponds to the inlet vent of the second facility such that the second sections of both facilities are in fluid communication.

7. The facility of claim 1, further comprising a liquid cooling system, the liquid cooling system being thermally coupled to the heat exchanger for removing heat from the heat exchanger.

8. The facility of claim 7, wherein the liquid cooling system is a self-contained cooling system not requiring an external supply of chilled liquid.

9. The facility of claim 1, wherein the equipment element is arranged in one or more racks, with each rack being associated with a heat exchanger to which heat generating sources of the equipment element within each rack are thermally coupled.

10. The facility of claim 9, comprising, in the first facility section, a plurality of racks arranged in a pair of rows having an access aisle between the two rows, the heat exchangers associated with the racks in one row located in one segregated second facility section, and the heat exchangers associated with the racks in the other row located in another segregated second facility section.

11. The facility of claim 1, wherein the facility is a data center, and wherein the equipment elements are computer equipment elements.

12. The facility of claim 1, wherein heat is concentrated in the two facility sections on either side of the facility.

13. A data center comprising:
    a first data center section comprising one or more computer equipment elements, each computer equipment element having one or more heat generating sources;
    a second data center section comprising a heat exchanger, the second data center section being substantially segregated from the first section; and
    a heat transfer element thermally coupled to at least some of the heat generating sources and further thermally coupled to the heat exchanger, the data center arranged such that, during operation of the computer equipment elements, the heat exchanger is cooled using natural ventilation in which heated air is naturally evacuated through an exhaust vent causing outside air to be drawn in through the inlet vent.

14. The data center of claim 13, wherein the data center is arranged in a transportable container, the data center further comprising a second transportable facility located on top of the data center such that the exhaust vent of the first data center corresponds to the inlet vent of the second data center such that the second sections of both data centers are in fluid communication.

15. The data center of claim 13, wherein the one or more equipment element is arranged in one or more racks, with each rack being associated with a heat exchanger to which heat generating sources of the equipment element within each rack are thermally coupled.

16. The data center of claim 15, comprising, in the first data center section, a plurality of racks arranged in a pair of rows having an access aisle between the two rows, the heat exchangers associated with the racks in one row located in one segregated second data center section, and the heat exchangers associated with the racks in the other row located in another segregated second data center section.

17. The data center of claim 13, wherein heat is concentrated in the two data center sections on either side of the data center.

18. A facility comprising:
    a first facility section comprising one or more equipment elements, each equipment element having one or more heat generating sources;
    a second facility section comprising a heat exchanger, the second facility section being substantially segregated from the first facility section;
    a heat transfer element thermally coupled to at least some of the heat generating sources and further thermally coupled to the heat exchanger; and
    wherein the facility is arranged in a transportable container, the facility further comprising a second transportable facility located on top of the facility such that the exhaust vent of the first facility corresponds to the inlet vent of the second facility such that the second sections of both facilities are in fluid communication.

* * * * *